United States Patent
Kubota et al.

(10) Patent No.: US 9,615,464 B2
(45) Date of Patent: Apr. 4, 2017

(54) METHOD OF MOUNTING SEMICONDUCTOR ELEMENT, AND SEMICONDUCTOR DEVICE

(71) Applicant: FUJITSU LIMITED, Kawasaki-shi, Kanagawa (JP)

(72) Inventors: Takashi Kubota, Chikuma (JP); Masayuki Kitajima, Yokohama (JP); Takatoyo Yamakami, Nagano (JP); Hidehiko Kira, Nagano (JP)

(73) Assignee: FUJITSU LIMITED, Kawasaki (JP)

( * ) Notice: Subject to any disclaimer, the term of this patent is extended or adjusted under 35 U.S.C. 154(b) by 378 days.

(21) Appl. No.: 14/073,998

(22) Filed: Nov. 7, 2013

(65) Prior Publication Data
US 2014/0285989 A1  Sep. 25, 2014

(30) Foreign Application Priority Data
Mar. 21, 2013 (JP) .................... 2013-058764

(51) Int. Cl.
*H05K 3/34* (2006.01)
*B23K 35/02* (2006.01)
(Continued)

(52) U.S. Cl.
CPC ............ *H05K 3/3484* (2013.01); *B23K 3/08* (2013.01); *B23K 35/02* (2013.01); *H01L 24/11* (2013.01);
(Continued)

(58) Field of Classification Search
CPC ..... H05K 3/3457; H05K 3/3463; B23K 35/02
See application file for complete search history.

(56) References Cited

U.S. PATENT DOCUMENTS 4,997,122 A * 3/1991 Zimmer .............. B23K 1/0004
228/165
5,203,075 A * 4/1993 Angulas ............ H01L 23/49816
228/180.22
(Continued)

FOREIGN PATENT DOCUMENTS

JP           04-273444 A      9/1992
JP           H10-116927 A     5/1998
(Continued)

OTHER PUBLICATIONS

Office Action issued in corresponding Japanese Application No. 2013-058764, dated Oct. 4, 2016.

*Primary Examiner* — Nathan Milakovich
(74) *Attorney, Agent, or Firm* — Squire Patton Boggs (US) LLP

(57) ABSTRACT

A method of mounting a semiconductor element, the method includes: attaching a first solder joint material onto a first pad formed on a substrate supplying a second solder joint material onto the first solder joint material, a second melting point of the second solder joint material being lower than a first melting point of the first solder joint material; arranging the semiconductor element so that a second pad formed on the semiconductor element faces the first pad and a joint gap is provided between the semiconductor element and the substrate; and performing reflow at a reflow temperature lower than the first melting point and higher than the second melting point to join the first solder joint material and the second solder joint material.

12 Claims, 18 Drawing Sheets

(51) Int. Cl.
  *B23K 3/08*    (2006.01)
  *H01L 23/00*   (2006.01)
  *H01L 31/167*  (2006.01)
  *H01S 5/022*   (2006.01)

(52) U.S. Cl.
  CPC .......... *H01L 24/13* (2013.01); *H01L 24/27* (2013.01); *H01L 24/73* (2013.01); *H01L 24/81* (2013.01); *H01L 24/92* (2013.01); *H01L 31/167* (2013.01); *H05K 3/3463* (2013.01); *H01L 24/16* (2013.01); *H01L 24/32* (2013.01); *H01L 24/83* (2013.01); *H01L 2224/03828* (2013.01); *H01L 2224/0401* (2013.01); *H01L 2224/11005* (2013.01); *H01L 2224/119* (2013.01); *H01L 2224/1132* (2013.01); *H01L 2224/1184* (2013.01); *H01L 2224/11334* (2013.01); *H01L 2224/11849* (2013.01); *H01L 2224/131* (2013.01); *H01L 2224/13018* (2013.01); *H01L 2224/13076* (2013.01); *H01L 2224/13082* (2013.01); *H01L 2224/13111* (2013.01); *H01L 2224/16225* (2013.01); *H01L 2224/16227* (2013.01); *H01L 2224/27001* (2013.01); *H01L 2224/32225* (2013.01); *H01L 2224/73204* (2013.01); *H01L 2224/81192* (2013.01); *H01L 2224/81815* (2013.01); *H01L 2224/831* (2013.01); *H01L 2224/8385* (2013.01); *H01L 2224/83192* (2013.01); *H01L 2224/9212* (2013.01); *H01L 2924/12042* (2013.01); *H01L 2924/12043* (2013.01); *H01L 2924/181* (2013.01); *H01L 2924/3841* (2013.01); *H01S 5/02272* (2013.01); *H05K 3/3436* (2013.01); *H05K 3/3494* (2013.01); *H05K 2203/041* (2013.01); *H05K 2203/1476* (2013.01); *Y10T 29/4913* (2015.01)

(56) References Cited

U.S. PATENT DOCUMENTS

| | | | | |
|---|---|---|---|---|
| 5,470,787 A * | 11/1995 | Greer | H01L 24/10 | 228/180.22 |
| 5,477,086 A * | 12/1995 | Rostoker | H01L 23/49811 | 257/673 |
| 5,545,589 A * | 8/1996 | Tomura | H01L 24/11 | 257/E21.508 |
| 5,557,695 A * | 9/1996 | Yamane | G02B 6/30 | 385/147 |
| 5,611,481 A * | 3/1997 | Akamatsu | B23K 35/26 | 228/123.1 |
| 5,785,234 A * | 7/1998 | Weiss | B23K 35/3612 | 228/180.22 |
| 5,872,400 A * | 2/1999 | Chapman | H01L 23/49816 | 257/737 |
| 5,889,326 A * | 3/1999 | Tanaka | H01L 24/11 | 257/737 |
| 5,984,164 A * | 11/1999 | Wark | B23K 3/0623 | 228/164 |
| 6,046,910 A * | 4/2000 | Ghaem | H01L 21/6835 | 174/260 |
| 6,115,913 A * | 9/2000 | Yamasaki | H01R 43/0235 | 29/830 |
| 6,125,043 A * | 9/2000 | Hauer | H01L 23/13 | 174/257 |
| 6,204,558 B1 * | 3/2001 | Yanagida | H01L 24/11 | 257/737 |
| 6,224,703 B1 * | 5/2001 | Yamasaki | H01L 21/4853 | 156/89.16 |
| 6,396,155 B1 * | 5/2002 | Nukiwa | H01L 21/563 | 257/778 |
| 6,419,550 B2 * | 7/2002 | Hembree | B24B 7/22 | 257/E21.508 |
| 6,583,517 B1 * | 6/2003 | Jimarez | H01L 23/488 | 257/779 |
| 6,590,287 B2 * | 7/2003 | Ohuchi | H01L 21/563 | 228/180.22 |
| 6,660,944 B1 * | 12/2003 | Murata | H01L 21/4853 | 174/250 |
| 6,664,637 B2 * | 12/2003 | Jimarez | B23K 1/0016 | 257/729 |
| 6,683,387 B1 * | 1/2004 | Brownfield | H01L 23/49811 | 257/778 |
| 6,756,680 B2 * | 6/2004 | Jimarez | B23K 1/0016 | 228/180.22 |
| 7,202,569 B2 * | 4/2007 | Tomono | H01L 21/563 | 257/734 |
| 7,414,319 B2 * | 8/2008 | Lin | H01L 21/4853 | 257/776 |
| 7,611,040 B2 * | 11/2009 | Kitae | H01L 21/4853 | 228/180.22 |
| 7,735,713 B2 * | 6/2010 | Kataoka | H01G 2/065 | 228/164 |
| 7,833,831 B2 * | 11/2010 | Kainuma | B23K 1/0016 | 257/778 |
| 8,390,117 B2 * | 3/2013 | Shimizu | B29C 43/18 | 257/738 |
| 8,556,157 B2 * | 10/2013 | Sakuyama | H01L 21/4853 | 228/164 |
| 8,828,860 B2 * | 9/2014 | Gruber | B23K 3/0638 | 438/612 |
| 8,920,934 B2 * | 12/2014 | Jiang | H01L 23/49816 | 257/772 |
| 9,059,152 B2 * | 6/2015 | Inoue | H01L 21/4853 | 174/260 |
| 2003/0011077 A1 * | 1/2003 | Morishima | H01L 21/563 | 257/778 |
| 2003/0048818 A1 | 3/2003 | Takeuchi et al. | | |
| 2003/0228084 A1 * | 12/2003 | Kanda | G02B 6/42 | 385/14 |
| 2004/0046252 A1 * | 3/2004 | Fujimori | H01L 21/563 | 257/734 |
| 2013/0098670 A1 * | 4/2013 | Inoue | H05K 3/4007 | 174/264 |

FOREIGN PATENT DOCUMENTS

| | | |
|---|---|---|
| JP | 2003-086877 A | 3/2003 |
| JP | 2008-071792 A | 3/2008 |

* cited by examiner

METHOD OF MOUNTING SEMICONDUCTOR ELEMENT, AND SEMICONDUCTOR DEVICE

CROSS-REFERENCE TO RELATED APPLICATION

This application is based upon and claims the benefit of priority of the prior Japanese Patent Application No. 2013-058764, filed on Mar. 21, 2013, the entire contents of which are incorporated herein by reference.

FIELD

Embodiments discussed herein are related to a method of mounting a semiconductor element and to a semiconductor device.

BACKGROUND

When a semiconductor optical element, such as a light receiving element or a light emitting element, is mounted over a substrate, a joint gap (a joint clearance) between the substrate and the semiconductor optical element is managed.

Related art is disclosed in Japanese Laid-open Patent Publication No. 2003-86877 or Japanese Laid-open Patent Publication No. 4-273444.

SUMMARY

According to one aspect of the embodiments, a method of mounting a semiconductor element, the method includes: attaching a first solder joint material onto a first pad formed on a substrate; supplying a second solder joint material onto the first solder joint material, a second melting point of the second solder joint material being lower than a first melting point of the first solder joint material; arranging the semiconductor element so that a second pad formed on the semiconductor element faces the first pad and a joint gap is provided between the semiconductor element and the substrate; and performing reflow at a reflow temperature lower than the first melting point and higher than the second melting point to join the first solder joint material and the second solder joint material.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Examples of a method of forming bumps (projecting electrodes) for joining a semiconductor optical element to a substrate include a plating method in which metal is separated from a plating solution, a vapor deposition method in which a film is formed by evaporating metal under vacuum, and a printing method in which a conductive paste is printed with a printing apparatus. The plating method may be unsuitable for mounting a semiconductor optical element because the joint reliability is insufficient for the joining at a low temperature. In the vapor deposition method or the printing method, no large joint gap may be formed.

Figure 1:
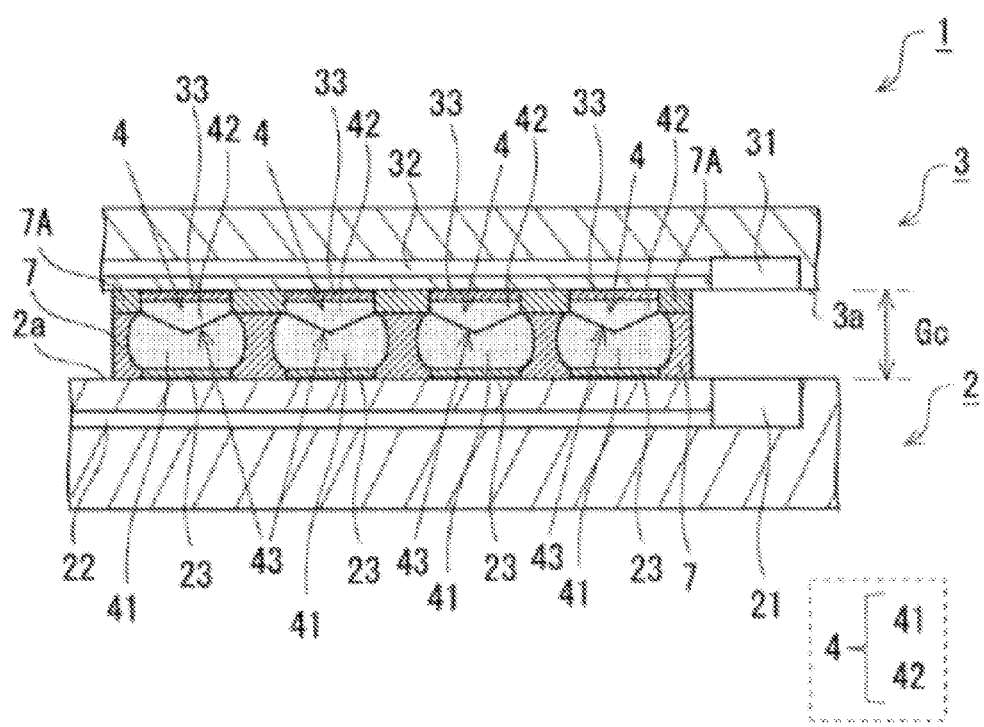
FIG. 1 illustrates an example of a semiconductor device.

FIG. 1 illustrates an example of a semiconductor device. In FIG. 1, a cross section of the semiconductor device 1 is depicted. The semiconductor device 1 may be an optical module that includes a circuit substrate 2 and an optical element silicon chip 3, which is a semiconductor optical element mounted over the circuit substrate 2. For example, the optical element silicon chip 3 may be a light emitting element, such as a vertical cavity semiconductor emission laser (VCSEL), and includes a light emitting portion 31, a waveguide (an optical transmission path) 32, and the like. The circuit substrate 2 includes a light receiving portion 21 that receives the light output from the light emitting portion 31 of the optical element silicon chip 3, a waveguide (an optical transmission path) 22 of the light received by the light receiving portion 21, and the like. A solder bump 4 is a projecting electrode formed of solder. The circuit substrate 2 and the optical element silicon chip 3 are joined via the solder bumps 4. The circuit substrate 2 and the optical element silicon chip 3 may be examples of the substrate and the semiconductor element, respectively.

Reference 2a represents an "upper surface" of the circuit substrate 2 and reference 3a represents a "lower surface" of the optical element silicon chip 3. As illustrated in FIG. 1, the optical element silicon chip 3 is joined to the upper surface 2a of the circuit substrate 2 via the solder bumps 4 by flip chip bonding. The lower surface 3a of the optical element silicon chip 3 and the upper surface 2a of the circuit substrate 2 are arranged so as to face each other. Reference Gc represents a "joint gap", which is a distance by which the upper surface 2a of the circuit substrate 2 and the lower surface 3a of the optical element silicon chip 3 lie apart from each other and is also referred to as a "joint clearance". For example, the size of the joint gap Gc in the semiconductor device 1 may be approximately 200 μm.

In the semiconductor device 1, which is for example, an optical module, the joint gap Gc may be formed to have a designed value with high precision so as to assure the light transmission characteristics of the optical element silicon chip 3. Since the optical element silicon chip 3 and the circuit substrate 2 are joined via the solder bumps 4, high precision may be desired in the height direction of the solder bumps 4. In many cases, the heat-resistant temperature of a semiconductor optical element, such as the optical element silicon chip 3, is relatively low and is for example, approximately 160° C. to 180° C. Thus, in mounting the optical element silicon chip 3, the reflow temperature is preferably not high in view of the heat-resistant temperature of the optical element silicon chip 3. Examples of the method of forming the bumps include the plating method, the vapor deposition method, and the printing method. The plating method may provide no sufficient joint reliability at a low temperature. In the vapor deposition method or the printing method, no large joint gap may be formed.

In the semiconductor device 1, the solder bump 4 that joins the circuit substrate 2 and the optical element silicon chip 3 includes a high melting point solder joint portion 41 and a low melting point solder joint portion 42. For example, the high melting point solder joint portion 41 may be a solder ball formed of high melting point solder (high temperature solder), such as tin-silver-copper (Sn—Ag—Cu)-based solder or the like. For example, the low melting point solder joint portion 42 may be formed of low melting point solder (low temperature solder), such as tin-bismuth (Sn—Bi)-based solder or the like. The melting point of the low melting point solder joint portion 42, which is for example, approximately 139° C., is lower than the melting point of the high melting point solder joint portion 41, which is for example, approximately 220° C.

The high melting point solder joint portion 41 is joined to an electrode pad 23 formed on the upper surface 2a of the circuit substrate 2, which is hereinafter referred to as a "substrate-side pad 23". The low melting point solder joint portion 42 is joined to an electrode pad 33 formed on the lower surface 3a of the optical element silicon chip 3, which is hereinafter referred to as an "element-side pad 33". The solder bump 4 may be integrally formed by the high melting point solder joint portion 41 and the low melting point solder joint portion 42, which are joined by performing temperature hierarchical bonding on the high melting point solder joint portion 41 and the low melting point solder joint portion 42 at a low temperature. For example, when performing reflow on the high melting point solder joint portion 41 and the low melting point solder joint portion 42, the high melting point solder joint portion 41 and the low melting point solder joint portion 42 may be integrally joined by causing the reflow temperature to be lower than the melting point of the high melting point solder joint portion 41 and higher than the melting point of the low melting point solder joint portion 42. An uneven joint portion 43 that has an uneven shape may be formed at a joint boundary surface between the high melting point solder joint portion 41 and the low melting point solder joint portion 42 of the solder bump 4. References 7 and 7A represent molding resin and second molding resin, respectively.

FIGS. 2 to 11 illustrate an example of a method of mounting an optical element silicon chip.

Figure 2:
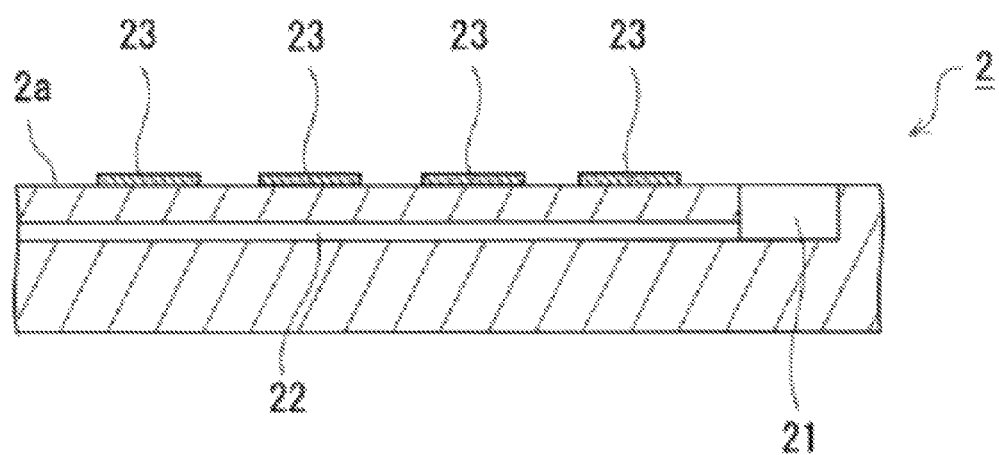
FIG. 2 illustrates an example of a circuit substrate.

FIG. 2 illustrates an example of a circuit substrate. In manufacturing the semiconductor device 1, the circuit substrate 2 illustrated in FIG. 2 is prepared. The circuit substrate 2 may be a resin substrate formed of epoxy resin or the like. The plurality of substrate-side pads 23 are formed and exposed at suitable positions of the upper surface 2a of the circuit substrate 2. The light receiving portion 21 that receives the light output from the light emitting portion 31 of the optical element silicon chip 3, the waveguide 22, and the like are formed in the circuit substrate 2.

Figure 3:
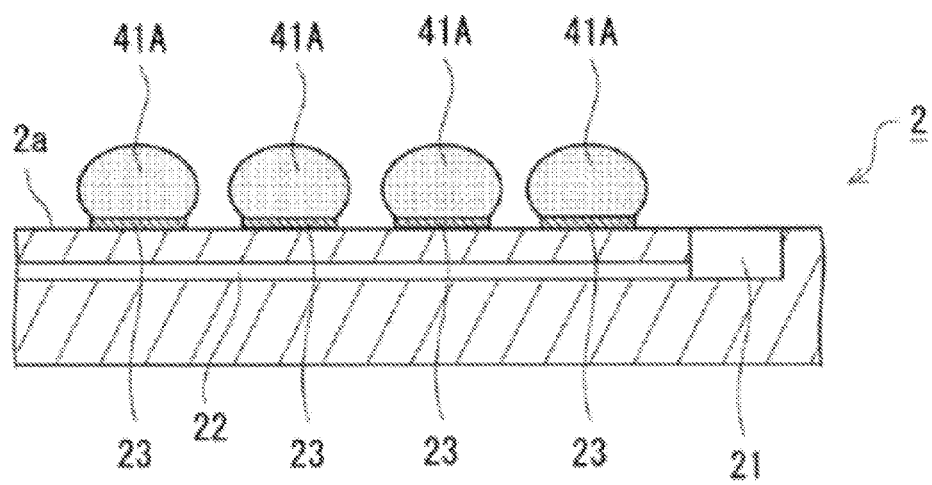
FIG. 3 illustrates an example of a process of attaching high melting point solder balls.

FIG. 3 illustrates an example of a process of attaching high melting point solder balls. As illustrated in FIG. 3, the solder ball 41A formed of high melting point solder (high temperature solder), such as Sn—Ag—Cu-based solder, which is herein also referred to as the "high melting point solder ball 41A", is attached to each of the substrate-side pads 23 of the circuit substrate 2. The high melting point solder ball 41A forms the high melting point solder joint portion 41 of the solder bump 4 illustrated in FIG. 1 after the optical element silicon chip 3 is mounted over the circuit substrate 2. The high melting point solder balls 41A may be attached to the substrate-side pads 23 as described below. A flux is supplied onto the substrate-side pads 23. The flux may be supplied onto the substrate-side pads 23 through squeezing using a printing apparatus. When the application of the flux to the substrate-side pads 23 is finished, the high melting point solder balls 41A are mounted on the flux, and heating (reflow) is performed with a reflow furnace. The reflow temperature may be a temperature higher than the melting temperature of the high melting point solder ball 41A and be, for example, approximately 235° C. The reflow causes the high melting point solder balls 41A to melt, and the high melting point solder ball 41A is integrally joined to each of the substrate-side pads 23. The high melting point solder ball 41A may be an example of a first solder joint material.

Figure 4:
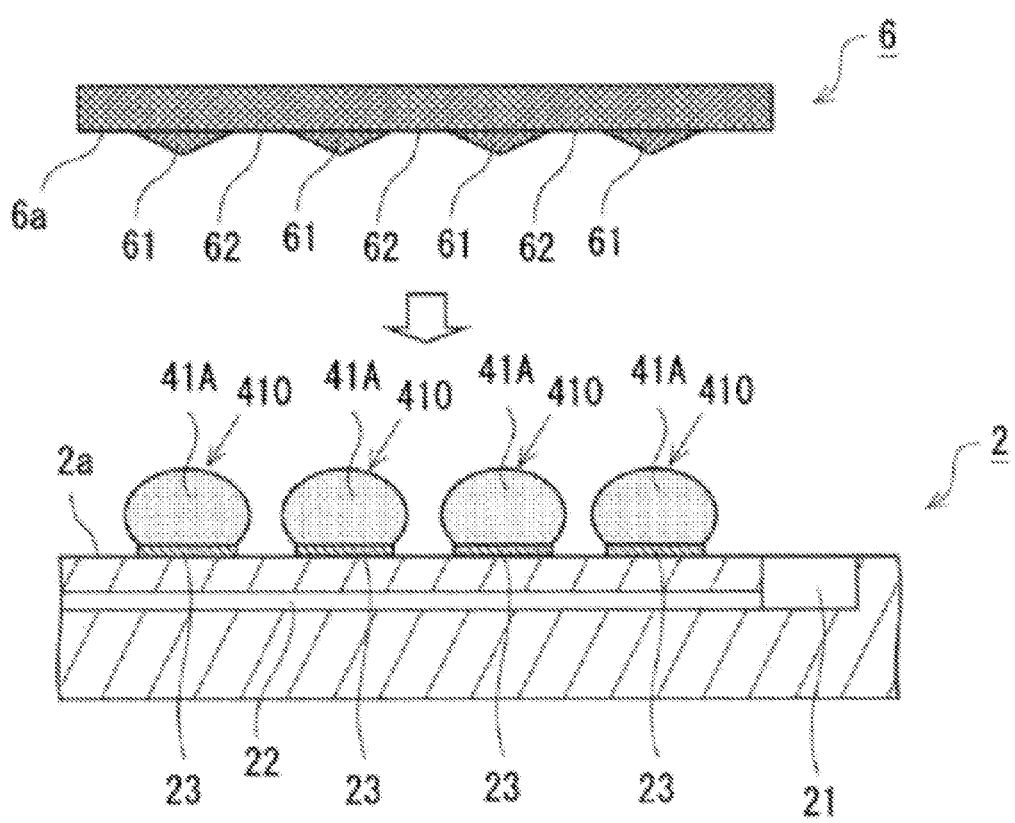
FIG. 4 illustrates an example of a jig for forming depressed portions.

FIG. 4 illustrates an example of a jig for forming depressed portions. The jig 6 for forming the depressed portions, which is hereinafter referred to as the "depressed portion forming jig 6", is prepared as illustrated in FIG. 4. The depressed portion forming jig 6 is provided to a semiconductor manufacturing apparatus, such as a flip chip bonder, which is used for mounting the optical element silicon chip 3 over the circuit substrate 2, and is heated through the supply of the heat from the semiconductor manufacturing apparatus. A plurality of projections 61 are provided to a lower surface 6a of the depressed portion forming jig 6 so as to correspond to the planar arrangement pattern of the solder balls 41. Although the projection 61 has an approximately conical shape, the shape of the projection 61 may be changed as appropriate. Flat portions 62 that are flat may be formed on part of the lower surface 6a of the depressed portion forming jig 6, where the projections 61 are not formed. The depressed portion forming jig 6 may be formed from a glass plate or be formed of another material.

Figure 5:
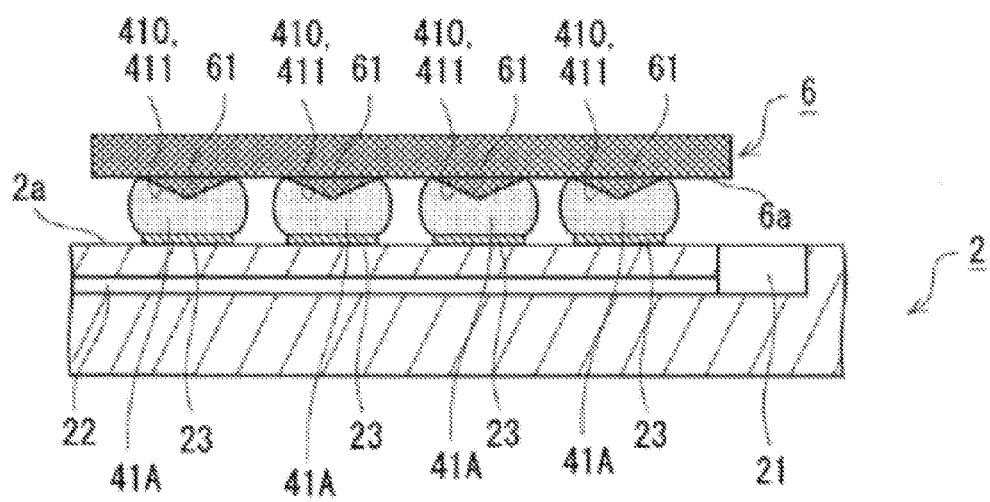
FIG. 5 illustrates an example of a process of forming the depressed portions.

FIG. 5 illustrates an example of a process of forming depressed portions. As illustrated in FIG. 5, the depressed portion forming jig 6 is pressed against top portions 410 of the high melting point solder balls 41A. The projections 61 formed on the lower surface 6a of the depressed portion forming jig 6 are arranged so as to correspond to the planar arrangement pattern of the high melting point solder balls 41A attached to the circuit substrate 2. The depressed portion forming jig 6 may be pressed against the high melting point solder balls 41A so that each of the projections 61 of the depressed portion forming jig 6 bites into the corresponding top portion 410 of the high melting point solder ball 41A.

The depressed portion forming jig 6 is pressed against the top portions 410 of the high melting point solder balls 41A while being heated to, for example, approximately 150° C. to 180° C. Since the high melting point solder balls 41A then soften because of the heat carried from the depressed portion forming jig 6, the projections 61 may be caused to bite into the top portions 410 of the high melting point solder balls 41A while reducing the stress that acts on the high melting point solder balls 41A. As a result, as illustrated in FIG. 5, the depressed portions 411, each of which has a conical (uneven) shape corresponding to the projection 61, are formed in the top portions 410 of the high melting point solder balls 41A ("the depressed portion forming process"). A single depressed portion, which is the depressed portion 411, may be formed in the top portion 410 of each of the high melting point solder balls 41A, or a plurality of depressed portions, which are the depressed portions 411, may be formed on a single high melting point solder ball, which is the high melting point solder ball 41A. The height of the projection 61 of the depressed portion forming jig 6 may be changed as appropriate, depending on the depth of the depressed portion 411 formed on the high melting point solder ball 41A.

Figure 6:
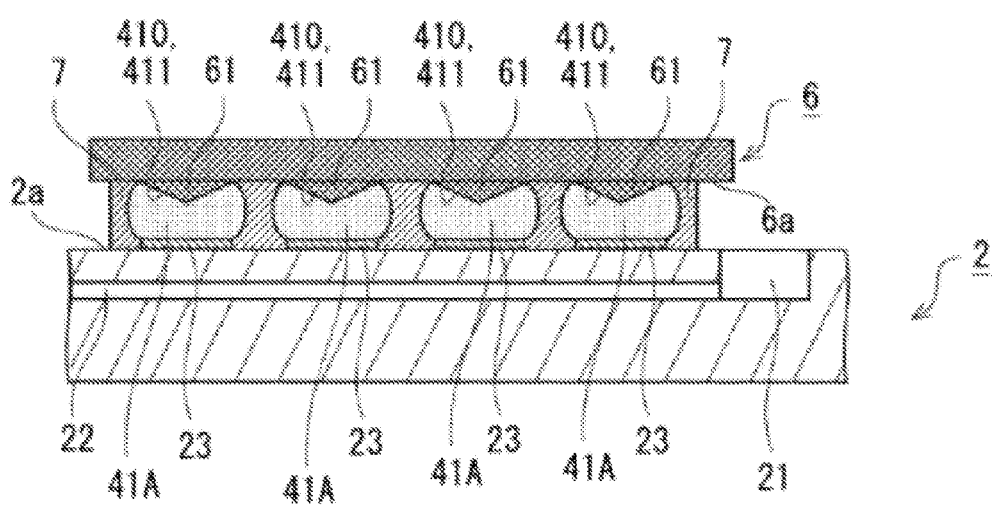
FIG. 6 illustrates an example of a sealing process.

FIG. 6 illustrates an example of a sealing process. As illustrated in FIG. 6, the molding resin 7 as a sealing material is supplied onto the circuit substrate 2 in the state in which the depressed portion forming jig 6 is pressed against the top portions 410 of the high melting point solder balls 41A. The sealing is performed on the high melting point solder balls 41A so that at least the top portions 410 of the high melting point solder balls 41A are exposed ("the sealing process"). Thermoplastic resin may be used as the molding resin 7. For example, thermoplastic epoxy resin may preferably be used as the thermoplastic resin.

In the sealing process, the molding resin 7 that is heated to, for example, approximately 80° C. and softened is poured over the upper surface 2a of the circuit substrate 2. Since the depressed portion forming jig 6 is left in the top portions 410 of the high melting point solder balls 41A at this time, the possibility of covering the top portions 410 of the high melting point solder balls 41A with the molding resin 7 may be reduced. For example, the possibility of covering the depressed portions 411 with the molding resin 7 may be reduced by performing the sealing operation in the state in which the depressed portion forming jig 6 is pressed against the top portions 410 of the high melting point solder balls 41A. The peripheries of the high melting point solder balls 41A are coated with the molding resin 7, other than the top portions 410 of the high melting point solder balls 41A. After that, the molding resin 7 is cooled and hardened, and then the depressed portion forming jig 6 is removed from the high melting point solder balls 41A.

Figure 7:
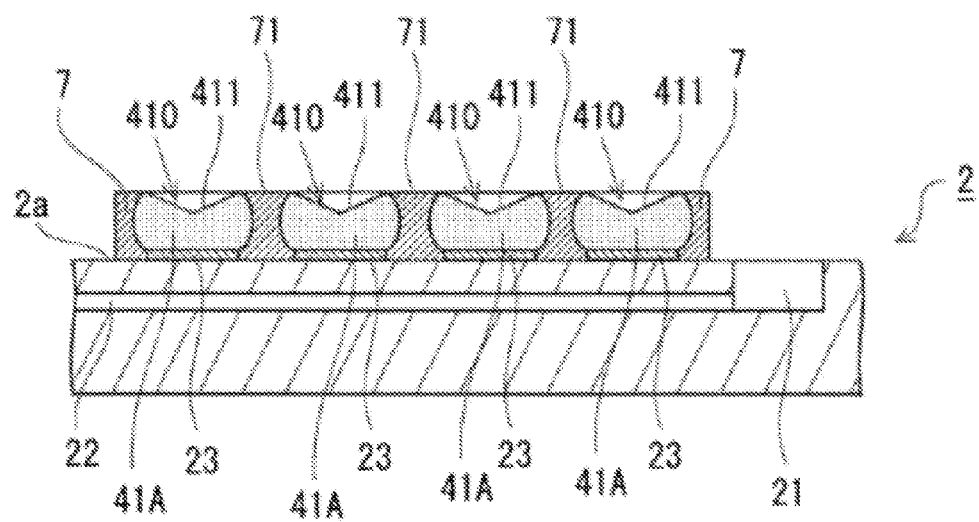
FIG. 7 illustrates an example of a high melting point solder ball from which a jig for forming depressed portions is removed.

The flat portions 62 are formed on the lower surface 6a of the depressed portion forming jig 6. The sealing operation is performed in the state in which the depressed portion forming jig 6 is attached to the top portions 410 of the high melting point solder balls 41A. Thus, the upper surface of the molding resin 7 is planarized by the flat portions 62 of the depressed portion forming jig 6 ("the planarizing process"). FIG. 7 illustrates an example of a high melting point solder ball from which a depressed portion forming jig is removed. For example, as illustrated in FIG. 7, in the state in which the depressed portion forming jig 6 is removed from the high melting point solder balls 41A, the depressed portions 411 are formed in the top portions 410 of the high melting point solder balls 41A, and flat surfaces 71 of the molding resin 7, which are planarized, are arranged so as to be continuous on the outer peripheries of the depressed portions 411.

Figure 8:
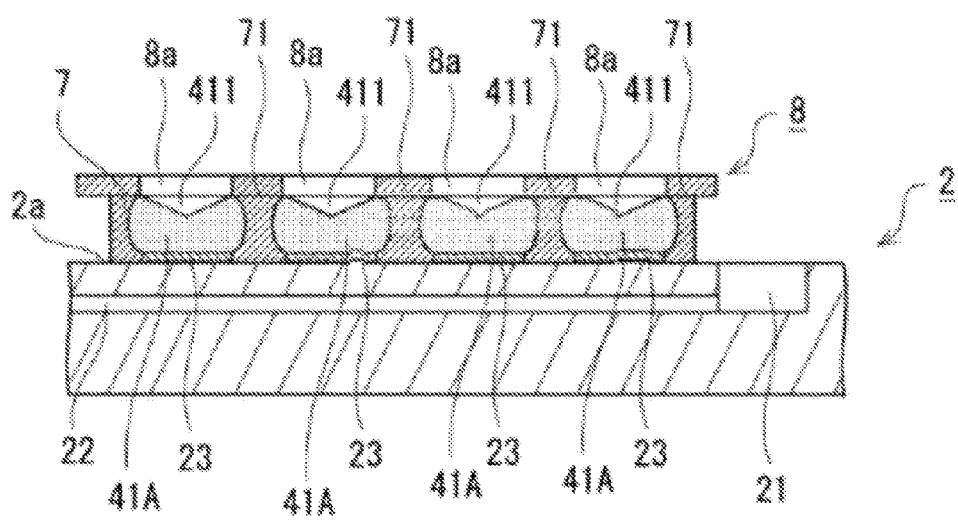
FIG. 8 illustrates an example of a screen plate placed over a circuit substrate.

FIG. 8 illustrates an example of a screen plate placed over a circuit substrate. As illustrated in FIG. 8, the screen plate 8 into which through holes 8a are formed at certain positions is placed over the circuit substrate 2. The screen plate 8 is set on the flat surfaces 71 of the molding resin 7. The plurality of through holes 8a are formed through the screen plate 8 at the positions corresponding to the planar arrangement pattern of the high melting point solder balls 41A. In setting the screen plate 8 over the circuit substrate 2, alignment is performed so as to cause the position of each of the through holes 8a to match the position of the corresponding high melting point solder ball 41A (the depressed portion 411).

Figure 9:
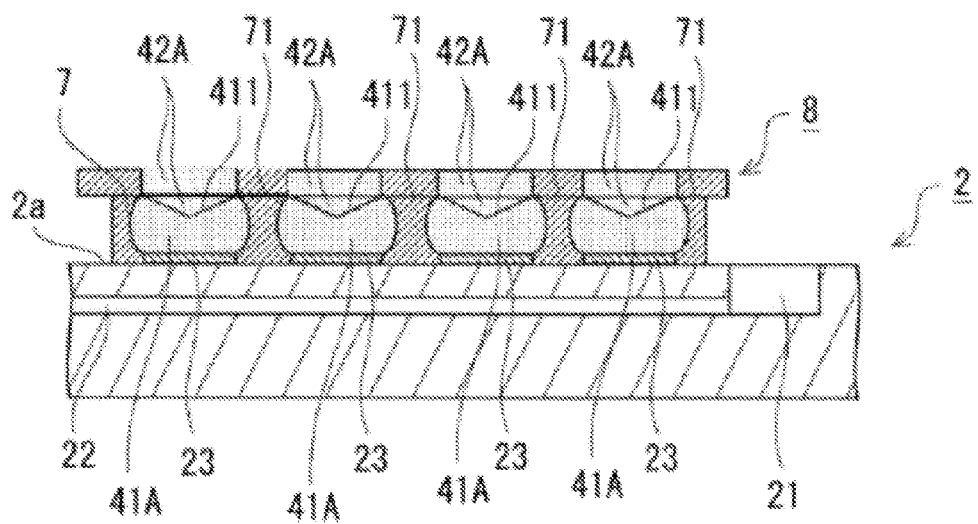
FIG. 9 illustrates an example of a supply of a low melting point solder paste.

FIG. 9 illustrates an example of a supply of a low melting point solder paste. As illustrated in FIG. 9, the low melting point solder paste 42A formed of, for example, Sn—Bi based solder or the like is supplied over the screen plate 8 using, for example, a printing apparatus. The low melting point solder paste 42A corresponds to the low melting point solder joint portion 42 of the solder bump 4, which is illustrated in FIG. 1, after the optical element silicon chip 3 is mounted over the circuit substrate 2. The depressed portion 411 of the high melting point solder ball 41A is filled with the low melting point solder paste 42A, which is supplied by the printing apparatus, through each of the through holes 8a by, for example, the squeezing using a squeegee. The melting point of the low melting point solder paste 42A is approximately 139° C. and is lower than the melting point of the high melting point solder ball 41A, which is approximately 220° C. The low melting point solder paste 42A may be an example of a second solder joint material.

Before supplying the low melting point solder paste 42A, the gaps between the high melting point solder balls 41A have been already filled with the molding resin 7. Accordingly, the squeezing using a squeegee may reduce the stress that acts on the high melting point solder ball 41A or the joint portion between the high melting point solder ball 41A and the substrate-side pad 23 if force that causes relative displacement of the screen plate 8 acts in a plane direction. Thus, occurrences of damage, such as a crack, in the high melting point solder ball 41A or the joint portion between the high melting point solder ball 41A and the substrate-side pad 23 may be reduced.

Since the screen plate 8 is set on the flat surfaces 71 of the molding resin 7, even when the adjustment for the squeegee is performed with relatively rough precision, the low melting point solder paste 42A may be printed with high precision and the work efficiency may be increased. Since the peripheries of the high melting point solder balls 41A are coated with the molding resin 7, the possibility of allowing the low melting point solder paste 42A that has flowed into the through holes 8a of the screen plate 8 to leak out of the gaps between the through holes 8a and the high melting point solder balls 41A may be reduced. A suitable amount of the low melting point solder paste 42A may be supplied onto the high melting point solder balls 41A with high precision. Since slipping of the low melting point solder paste 42A from the high melting point solder balls 41A may be reduced, short circuits caused between the adjacent substrate-side pads 23 may be reduced.

Figure 10:
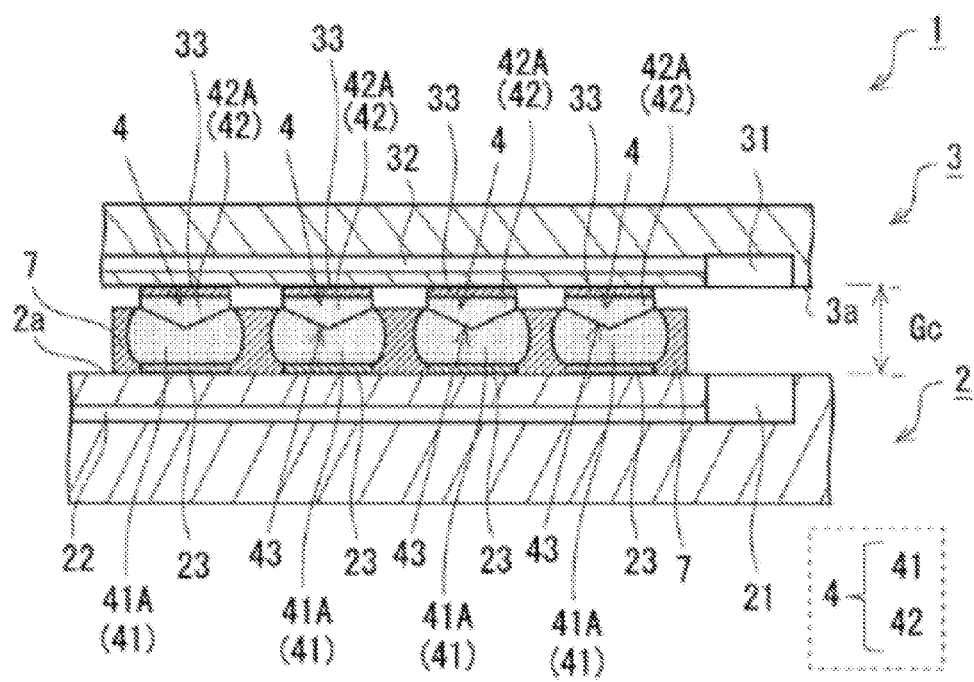
FIG. 10 illustrates an example of a reflow operation.

FIG. 10 illustrates an example of a reflow process. The screen plate 8 is removed from the circuit substrate 2, and as illustrated in FIG. 10, the optical element silicon chip 3 is arranged so that the lower surface 3a of the optical element silicon chip 3 faces the upper surface 2a of the circuit substrate 2. The plurality of element-side pads 33 are exposed and formed at suitable positions of the lower surface 3a of the optical element silicon chip 3. The light emitting portion 31 and the waveguide 32 are formed in the optical element silicon chip 3. The position of the optical element silicon chip 3 relative to the circuit substrate 2 is adjusted so that the plane positions of the element-side pad 33 and the substrate-side pad 23 match and a certain joint gap, which is the joint gap Gc, is provided.

The heating (the reflow) is performed on the circuit substrate 2 and the optical element silicon chip 3 with the reflow furnace ("the reflow process"). The reflow temperature (the heating temperature) for performing the reflow may be set to be lower than the melting point of the high melting point solder ball 41A and higher than the melting point of the low melting point solder paste 42A. For example, the reflow temperature may be set to approximately 160° C. In the reflow, since the reflow temperature is lower than the melting point of the high melting point solder ball 41A, the shape of the high melting point solder ball 41A remains unchanged and the original shape is maintained. Since the reflow temperature is higher than the melting point of the low melting point solder paste 42A, the low melting point solder paste 42A melts.

The size of the high melting point solder ball 41A is set to be slightly smaller than the size obtained by subtracting the thicknesses of the substrate-side pad 23 and the element-side pad 33 from the joint gap Gc. The high melting point solder ball 41A whose shape remains unchanged in the reflow is utilized as a spacer (a space ensuring member) for ensuring the joint gap Gc, and the gap between the element-side pad 33 and the high melting point solder ball 41A is infilled with the low melting point solder paste 42A. The low melting point solder paste 42A that has melted in the reflow diffuses in the solder alloy of the high melting point solder ball 41A, and the low melting point solder paste 42A and the high melting point solder ball 41A are integrally joined. After that, the low melting point solder paste 42A and the high melting point solder balls 41A are cooled and the solder bumps 4 illustrated in FIG. 1 are complete. The low melting point solder paste 42A corresponds to the low melting point solder joint portion 42 of the solder bump 4, and the high melting point solder ball 41A corresponds to the high melting point solder joint portion 41 of the solder bump 4.

Figure 11:
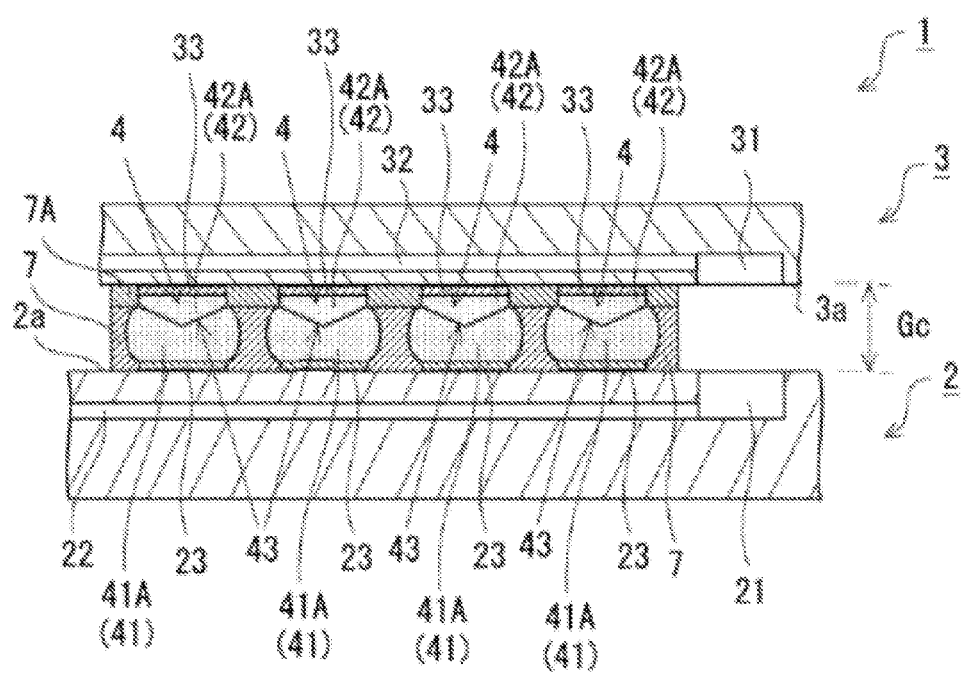
FIG. 11 illustrates an example of a filling process of second molding resin.

FIG. 11 illustrates an example of a filling process of second molding resin. As illustrated in FIG. 11, the gaps between the molding resin 7 and the optical element silicon chip 3 are filled with the second molding resin 7A. Thermosetting resin that softens at a temperature lower than the melting point of the low melting point solder paste 42A may be used as the second molding resin 7A. The above-described operation completes the operations of mounting the optical element silicon chip 3 over the circuit substrate 2, and the semiconductor device 1 is fabricated.

In the process of mounting the optical element silicon chip 3, the temperature hierarchical bonding is performed at a temperature lower than the melting point of the high melting point solder ball 41A (the high melting point solder joint portion 41). Since the high melting point solder ball 41A whose shape is maintained in the reflow is utilized as a spacer, the joint gap Gc that is large may be ensured easily. The gaps between the element-side pads 33 of the optical element silicon chip 3 and the high melting point solder balls 41A are filled with the low melting point solder paste 42A that melts in the reflow. Thus, even if the high melting point solder balls 41A slightly vary in height or the optical element silicon chip 3 slightly leans, the variation (errors) in the height direction may be absorbed because of the low melting point solder paste 42A. When the designed size of the joint gap Gc between the circuit substrate 2 and the optical element silicon chip 3 is large, the joint gap Gc may be formed with high precision to have the designed size. According to the above-described mounting method, the dimensional precision of the joint gap Gc may be enhanced.

In the processes of mounting the optical element silicon chip 3, the depressed portions 411 are provided to the top portions 410 of the high melting point solder balls 41A (see FIG. 7 and the like). Thus, the uneven joint portion 43 that has an uneven shape is formed at the boundary surface where the high melting point solder joint portion 41 (the high melting point solder ball 41A) and the low melting point solder joint portion 42 (the low melting point solder paste 42A) of the solder bump 4 are joined. When the uneven joint portion 43 is formed at the joint boundary surface of the high melting point solder joint portion 41 and the low melting point solder joint portion 42, the mechanical strength against the external force may increase through the mutual mechanical engagement action of the high melting point solder joint portion 41 and the low melting point solder joint portion 42.

Because of the uneven shape of the joint boundary surface between the high melting point solder joint portion 41 and the low melting point solder joint portion 42, the area in which the high melting point solder joint portion 41 and the low melting point solder joint portion 42 are in contact may increase. Thus, in the reflow, agglomerations of the low melting point solder paste 42A may be reduced, the diffusion of the low melting point solder paste 42A into the high melting point solder ball 41A may be promoted, and the integration of the high melting point solder joint portion 41 and the low melting point solder joint portion 42 may be promoted. Interfacial peeling between different kinds of solder alloys may be reduced and the mutual joint strength may increase.

According to the process of mounting the optical element silicon chip 3, the joint gap (the joint clearance) Gc between the optical element silicon chip 3 and the circuit substrate 2 may be controlled to have a suitable value with high precision. Even when the reflow temperature is set to be relatively low in mounting the optical element silicon chip 3, high joint reliability may be ensured.

In the process of mounting the optical element silicon chip 3, the sealing process using the molding resin 7 may be performed before forming the depressed portions 411 in the top portion 410 of the high melting point solder balls 41A. The sealing process using the molding resin 7 may be omitted. Even when the sealing operation is omitted, the low melting point solder paste 42A supplied from the printing apparatus is received by the depressed portions 411 because of the depressed portions 411 formed in the top portions 410 of the high melting point solder balls 41A. Thus, the slipping of the low melting point solder paste 42A from the high melting point solder ball 41A may be reduced. A suitable amount of the low melting point solder paste 42A is supplied to the high melting point solder balls 41A, and the joint reliability of the optical element silicon chip 3 and the circuit substrate 2 via the solder bumps 4 may be enhanced.

In the process of mounting the optical element silicon chip 3, the planarizing operation in which the upper surface of the molding resin 7 is planarized is performed by utilizing the lower surface 6a of the depressed portion forming jig 6. The depressed portion forming operation in which the depressed portions 411 are formed in the top portions 410 of the high melting point solder balls 41A and the planarizing operation may be performed at the same time. Thus, the number of processes for mounting the optical element silicon chip 3 may be reduced and the manufacturing efficiency of the semiconductor device 1 may be enhanced.

The planarizing operation in which the upper surface of the molding resin 7 is planarized may be performed before supplying the low melting point solder paste 42A of the low melting point solder joint portion 42 to the depressed portions 411 or after the depressed portion forming process.

Referring to FIGS. 12 to 18, operations of mounting an optical element silicon chip 3 are described. In FIGS. 12 to 18, the same references are given to the elements the same as or similar to the elements illustrated in FIGS. 2 to 11 and the explanation thereof may be omitted or reduced.

Figure 12:
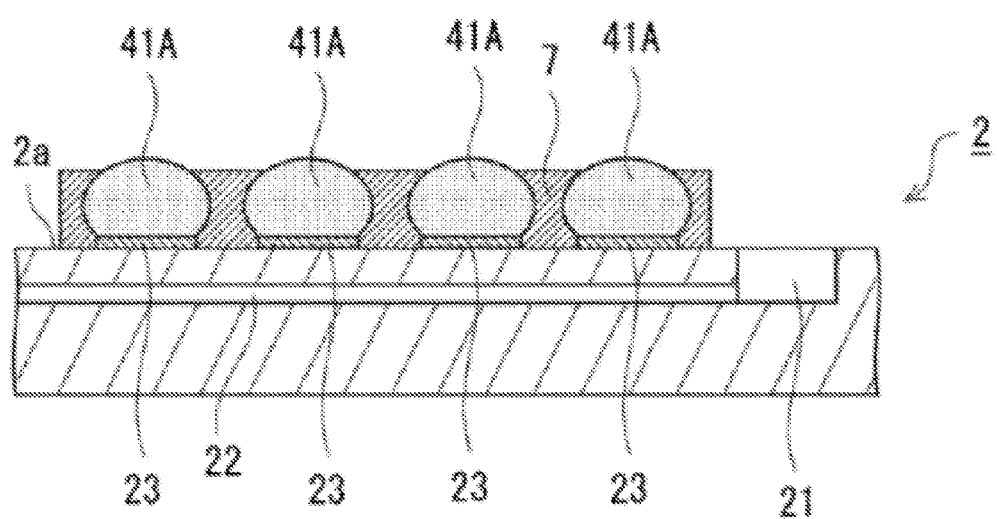
FIG. 12 illustrates an example of a sealing operation.

The operations performed before attaching the high melting point solder ball 41A to each of the substrate-side pads 23 of the circuit substrate 2 may be common to the above-described operations. FIG. 12 illustrates an example of a sealing process. As illustrated in FIG. 12, the molding resin 7 as a sealing material is supplied to the upper surface 2a of the circuit substrate 2 in which the high melting point solder balls 41A are attached. The molding resin 7 may be formed of thermoplastic resin. The molding resin 7 that is softened is supplied and the high melting point solder balls 41A are sealed with the molding resin 7 so that at least the top portions 410 of the high melting point solder balls 41A are exposed ("the sealing process"). The upper surface of the molding resin 7 supplied in the sealing process may be unplanarized.

Figure 13:
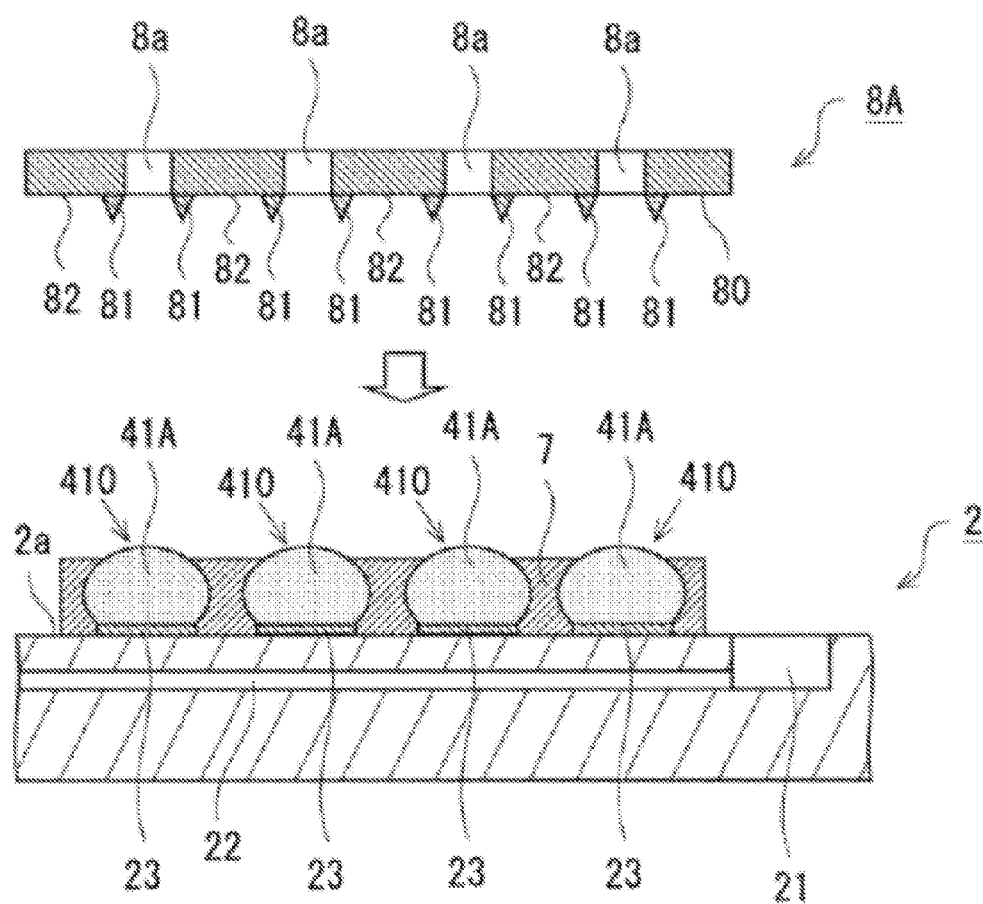
FIG. 13 illustrates an example of a screen plate with projections.

FIG. 13 illustrates an example of a screen plate with projections. The screen plate with projections 8A illustrated in FIG. 13 is prepared. Similar to the above-described screen plate 8, the plurality of through holes 8a are formed through the screen plate with projections 8A at the positions corresponding to the arrangement pattern of the high melting point solder balls 41A. A plurality of projections 81 are formed on a lower surface 80 of the screen plate with projections 8A. The projections 81 are provided two by two close to the edges of the through holes 8a, which are provided on the lower surface 80 of the screen plate with projections 8A, so as to project downward from the lower surface 80. The number of the projections 81 corresponding to each of the through holes 8a may be changed. Flat portions 82 that are flat are formed on part of the lower surface 80 of the screen plate with projections 8A, where the projections 81 are not formed.

Figure 14:
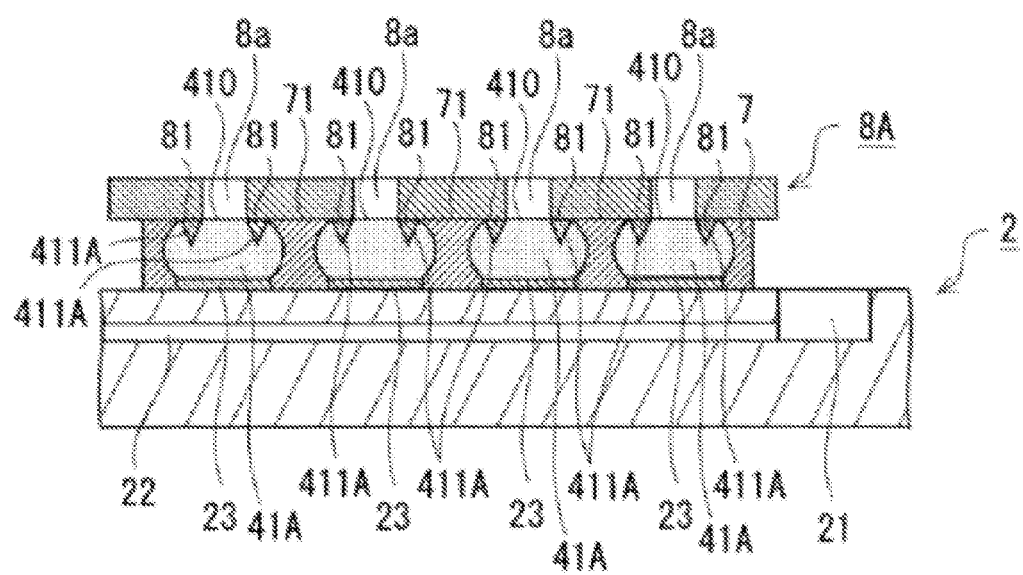
FIG. 14 illustrates an example of a process of forming depressed portions.

FIG. 14 illustrates an example of a process of forming depressed portions. As illustrated in FIG. 14, alignment is performed so as to cause the position of each of the through holes 8a to match the position of the corresponding high melting point solder ball 41A, and the screen plate with projections 8A is placed over the circuit substrate 2. In placing the screen plate with projections 8A over the circuit substrate 2, the projections 81 provided to the lower surface 80 of the screen plate with projections 8A are pressed against the top portions 410 of the high melting point solder balls 41A and caused to bite into the top portions 410 of the high melting point solder balls 41A. Thus, depressed portions 411A are formed in each of the top portions 410 of the high melting point solder balls 41A. Since two projections, for example the projections 81, are provided to the periphery of each of the through holes 8a of the screen plate with projections 8A, two depressed portions, for example, the depressed portions 411A, are formed in each of the top portions 410 of the high melting point solder balls 41A ("the depressed portion forming process"). The depressed portion forming process may be performed before the molding resin 7 hardens. When the flat portions 82 of the screen plate with projections 8A are pressed against the upper surface of the molding resin 7 that is in the state of being softened, the flat surfaces 71 are formed on the upper surface of the molding resin 7. For example, the upper surface of the molding resin 7 is planarized.

The high melting point solder balls 41A are sealed with the molding resin 7 with which the peripheries of the high melting point solder balls 41A are filled. Thus, in pressing the projections 81 of the screen plate with projections 8A against the top portions 410 of the high melting point solder balls 41A to form the depressed portions 411A, the possibility of allowing large stress to act on the joint portions between the high melting point solder balls 41A and the substrate-side pads 23 may be reduced. The sealing operation may be performed before the depressed portion forming operation.

Figure 15:
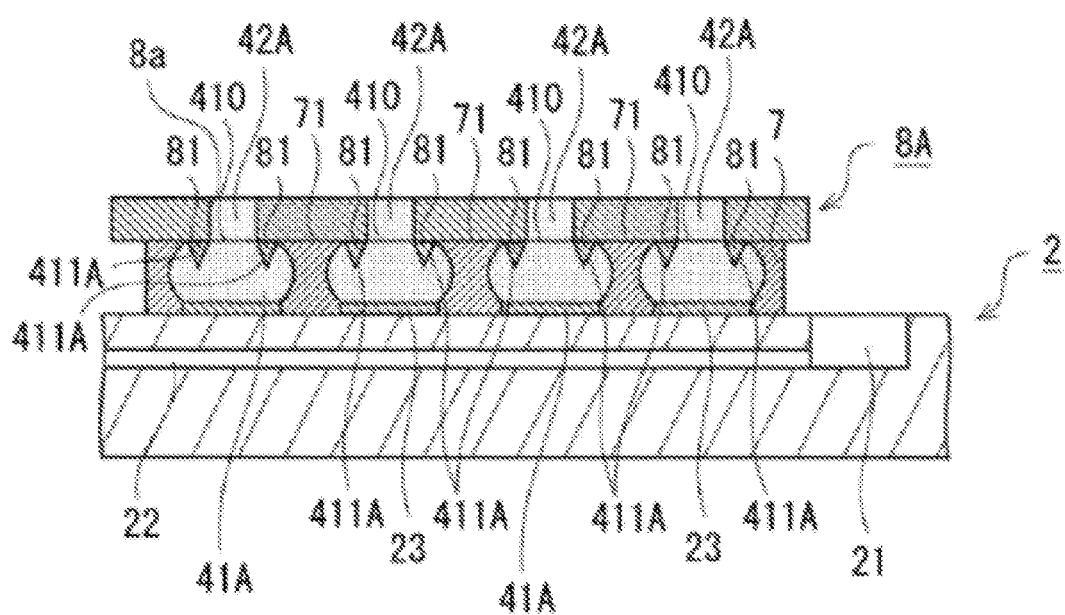
FIG. 15 illustrates an example of a supply of a low melting point solder paste.

FIG. 15 illustrates an example of a supply of a low melting point solder paste. As illustrated in FIG. 15, the low melting point solder paste 42A is supplied onto the screen plate with projections 8A using, for example, a printing apparatus. The low melting point solder paste 42A may be the same as already described. The low melting point solder paste 42A supplied by the printing apparatus is supplied to the top portions 410 of the high melting point solder balls 41A through the through holes 8a by the squeezing using a squeegee.

In supplying the low melting point solder paste 42A to the top portions 410 of the high melting point solder balls 41A, the peripheries of the high melting point solder ball 41A have been coated (sealed) with the molding resin 7. Thus, the slipping of the low melting point solder paste 42A from the top portions 410 of the high melting point solder balls 41A may be reduced, and a suitable amount of the low melting point solder paste 42A may be transferred onto the high melting point solder balls 41A with high precision. Since the flat surfaces 71 that are flat are formed on the upper surface of the molding resin 7, the low melting point solder paste 42A may be printed with high precision. In supplying the low melting point solder paste 42A, the stress that acts on the joint portions between the high melting point solder balls 41A and the substrate-side pads 23 may be reduced and breakages in the joint portions may be suppressed.

Figure 16:
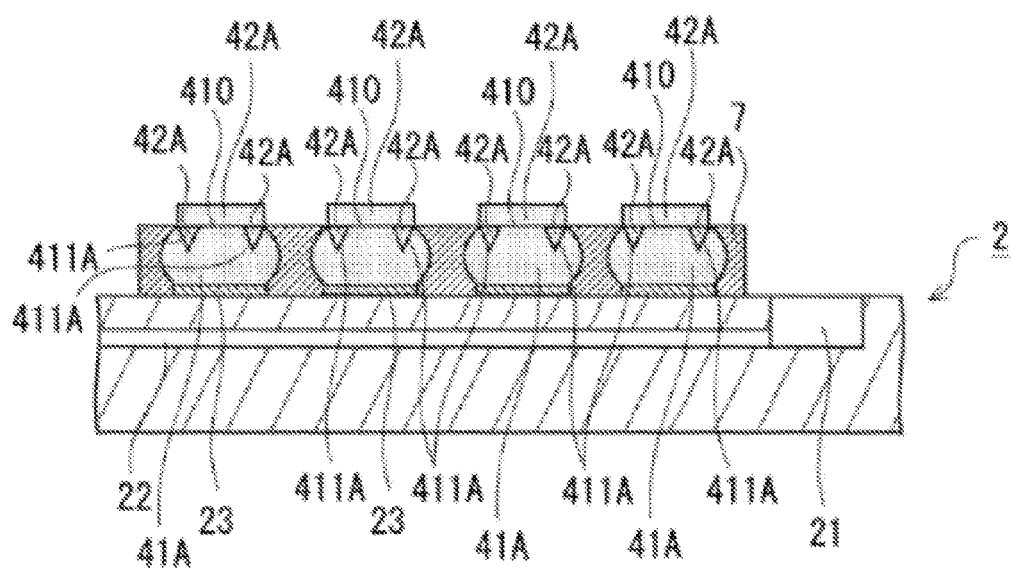
FIG. 16 illustrates an example of a circuit substrate from which a screen plate with a projection is removed.
Figure 17:
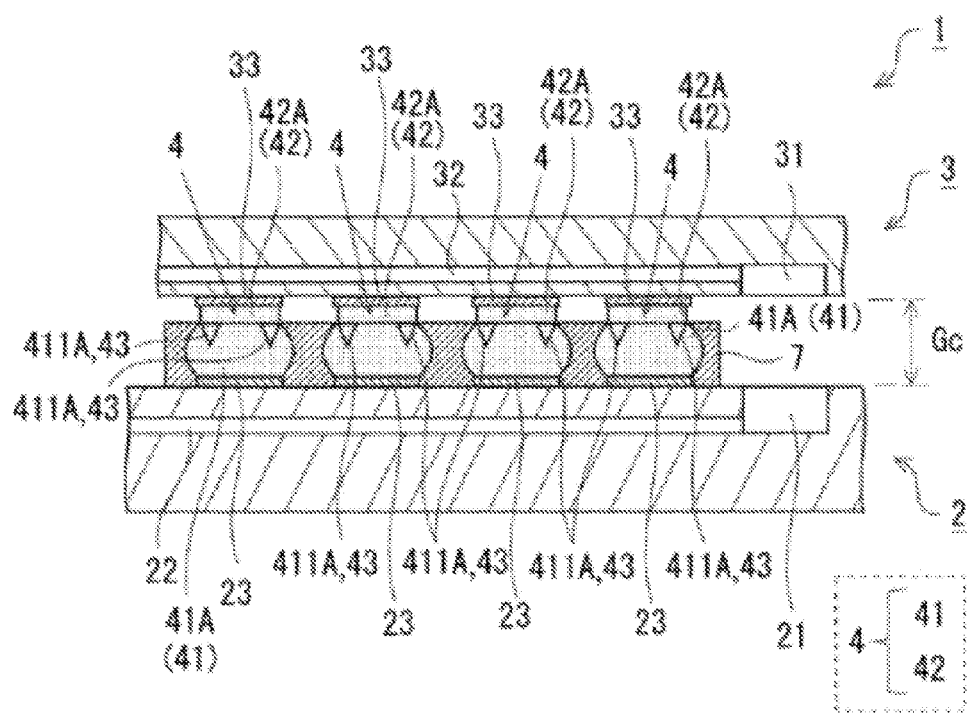
FIG. 17 illustrates an example of a reflow process.

FIG. 16 illustrates an example of a circuit substrate from which a screen plate with projection is removed. The screen plate with projections 8A is removed from the circuit substrate 2. Then, as illustrated in FIG. 16, the low melting point solder paste 42A with which the through holes 8a of the screen plate with projections 8A are filled flows and fills the depressed portions 411A formed in the top portions 410 of the high melting point solder balls 41A. FIG. 17 illustrates an example of a reflow process. As illustrated in FIG. 17, the optical element silicon chip 3 is arranged so that the lower surface 3a of the optical element silicon chip 3 faces the upper surface 2a of the circuit substrate 2. The relative positions of the optical element silicon chip 3 and the circuit substrate 2 are adjusted so that the plane positions of the element-side pad 33 and the substrate-side pad 23 match and a certain joint gap, for example, the joint gap Gc is provided between the optical element silicon chip 3 and the circuit substrate 2.

The heating (the reflow) is performed on the circuit substrate 2 and the optical element silicon chip 3 with the reflow furnace ("the reflow process"). The reflow temperature may be a temperature lower than the melting point of the high melting point solder ball 41A and higher than the melting point of the low melting point solder paste 42A. Thus, in the reflow, the high melting point solder ball 41A maintains the shape before the reflow while the low melting point solder paste 42A melts. The size of the high melting point solder ball 41A is set to be slightly smaller than the size obtained by subtracting the thicknesses of the substrate-side pad 23 and the element-side pad 33 from the joint gap Gc. The high melting point solder ball 41A whose shape is not changed in the reflow is utilized as a spacer for ensuring the joint gap Gc, and the gap between the element-side pad 33 and the high melting point solder ball 41A is infilled with the low melting point solder paste 42A. The low melting point solder paste 42A and the high melting point solder balls 41A are cooled, and similar to FIG. 10, the solder bumps 4 are formed. The low melting point solder paste 42A corresponds to the low melting point solder joint portion 42 of the solder bump 4, and the high melting point solder ball 41A corresponds to the high melting point solder joint portion 41 of the solder bump 4.

Figure 18:
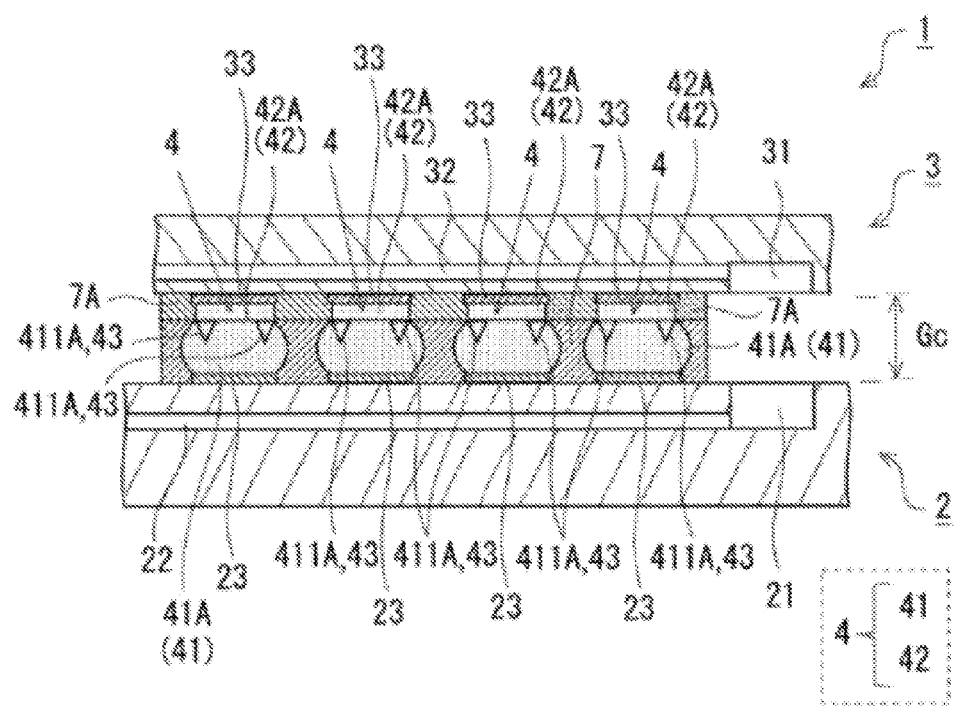
FIG. 18 illustrates an example of a filing process of a second molding resin.

FIG. 18 illustrates an example of a filing process of a second molding resin. As illustrated in FIG. 18, the gaps between the molding resin 7 and the optical element silicon chip 3 are filled with the second molding resin 7A. Thermosetting resin that softens at a temperature lower than the melting point of the low melting point solder 42 may preferably be used as the second molding resin 7A. The above-described operation completes the operations of mounting the optical element silicon chip 3 over the circuit substrate 2, and the semiconductor device 1 is fabricated.

The depressed portions 411A are provided to the top portions 410 of the high melting point solder balls 41A. Thus, the uneven joint portion 43 that has an uneven shape is formed at the boundary surface where the high melting point solder joint portion 41 (the high melting point solder ball 41A) and the low melting point solder joint portion 42 (the low melting point solder paste 42A) of the solder bump 4 are joined. The mechanical strength against the external force of the solder bumps 4 may increase through the mutual mechanical engagement action of the high melting point solder joint portion 41 and the low melting point solder joint portion 42. Because of the uneven joint portion 43 having an uneven shape, the area in which the high melting point solder joint portion 41 and the low melting point solder joint portion 42 are in contact may increase. The interfacial peeling between different kinds of solder alloys may be reduced and the joint strength between the high melting point solder joint portion 41 and the low melting point solder joint portion 42 may be enhanced. Superior joint reliability (bonding reliability) of the circuit substrate 2 and the optical element silicon chip 3 via the solder bumps 4 may be provided. Since the temperature hierarchical bonding for which the reflow temperature is lower than the melting point of the high melting point solder ball 41A (the high melting point solder joint portion 41) is performed, the joint gap Gc that is large may be obtained easily, and the dimensional precision of the joint gap Gc may be raised. For example, even when the joint gap Gc between the circuit substrate 2 and the optical element silicon chip 3 is designed to be large in size, the dimensional precision of the joint gap Gc that is formed may be raised.

The screen plate with projections 8A that includes the projections 81 and the flat portions 82 is used to transfer the low melting point solder paste 42A to the top portions 410 of the high melting point solder balls 41A. Thus, the transfer of the low melting point solder paste 42A to the top portions 410 of the high melting point solder balls 41A, the formation of the depressed portions 411A in the top portions 410 of the high melting point solder balls, and the planarization of the upper surface of the molding resin 7 are collectively performed in the identical process. The number of processes for mounting the optical element silicon chip 3 may be reduced and the manufacturing efficiency of the semiconductor device 1 may be enhanced.

In the state in which the peripheries of the high melting point solder balls 41A are sealed with the molding resin 7, the depressed portions 411A are formed in the top portions 410 of the high melting point solder balls 41A. Thus, in pressing the projections 81 of the screen plate with projections 8A against the top portions 410 of the high melting point solder balls 41A, the stress that acts on the joint portions between the high melting point solder balls 41A and the substrate-side pads 23 may be reduced. Breakages in the joint portions between the high melting point solder balls 41A and the substrate-side pads 23 may be reduced.

For example, the semiconductor element mounted over the circuit substrate 2 may be a light emitting element, such as a VCSEL, or be a light receiving element, such as a photodiode. The mounting method described above is applied not only to optical elements, which include the VCSEL and the photodiode, but may also be applied when mounting various semiconductor elements.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method of mounting a semiconductor element, the method comprising:
    attaching a first solder joint material onto a first pad formed on a substrate;
    forming a depressed portion in a top portion of the first solder joint material;
    supplying a second solder joint material to the depressed portion in such a manner that at least a central portion of a surface of a second pad comes in contact with the second solder joint material, a second melting point of the second solder joint material being lower than a first melting point of the first solder joint material;
    arranging the semiconductor element so that the second pad formed on the semiconductor element faces the first pad and a joint gap is provided between the semiconductor element and the substrate;
    performing reflow at a reflow temperature lower than the first melting point and higher than the second melting point to join the first solder joint material and the second solder joint material,
    pressing a jig against the top portion of the first solder joint material so as to form the depressed portion;
    supplying a first sealing material onto the substrate in a state in which the jig is pressed against the top portion of the first solder material; and
    sealing the first solder joint material in the state in which the jig is pressed against the top portion.

2. The method according to claim 1, further comprising:
    placing a screen plate having a through hole over the first solder joint material; and
    matching a position of the through hole to a position of the depressed portion to supply the second solder joint material to the depressed portion via the through hole.

3. The method according to claim 1, wherein
the sealing the first solder joint material with the first sealing material is performed in the state so that at least a top portion of the first solder joint material is exposed.

4. The method according to claim 3, further comprising:
placing a screen plate having a through hole over the first solder joint material; and
supplying the second solder joint material to the depressed portion via the through hole.

5. The method according to claim 1, wherein the depressed portion is formed while heating the top portion.

6. A semiconductor device comprising:
a substrate including a first surface on which a first pad is formed, a light receiving portion that receives light output from a light emitting portion and a first waveguide that transmits the light received by the light receiving portion;
a semiconductor element mounted over the substrate and including a second pad on a second surface of the semiconductor element, the light emitting portion that emits light and a second waveguide that transmits the light to be emitted by the light emitting portion; and
a solder bump configured to join the first pad and the second pad,
wherein the solder bump includes:
a first solder joint portion formed on the first pad and coupled directly to the first pad; and
a second solder joint portion provided between the first solder joint portion and the second pad, a second melting point of the second solder joint portion being lower than a first melting point of the first solder joint portion, and
wherein the first waveguide is provided along the first surface and the second waveguide is provided along the second surface.

7. The semiconductor device according to claim 6, wherein a boundary surface where the first solder joint portion and the second solder joint portion are joined has an uneven shape.

8. The semiconductor device according to claim 6, wherein the first solder joint portion is tin-silver-copper (Sn—Ag—Cu) based solder and the second solder joint portion is tin-bismuth (Sn—Bi) based solder.

9. The method according to claim 3, further comprising:
supplying a second sealing material onto the first sealing material after a reflow; and
sealing the second solder joint material with the second sealing material.

10. The semiconductor device according to claim 6, wherein the first solder joint portion formed on the first pad includes a depressed portion in a top portion, and the second solder joint portion includes a projection to fit into the depressed portion and is coupled directly to the second pad.

11. The semiconductor device according to claim 6, wherein a first part of the light receiving portion is exposed from the first surface, a second part of the light emitting portion is exposed from the second surface and the first part and the second part face with each other.

12. The semiconductor device according to claim 6, wherein the first waveguide is coupled to the light receiving portion in the substrate and extends in the substrate at a distance from the first surface, and the second waveguide is coupled to the light emitting portion in the semiconductor element and extends in the semiconductor element at a distance from the second surface.

* * * * *